(12) United States Patent
Pagaila et al.

(10) Patent No.: US 8,435,834 B2
(45) Date of Patent: May 7, 2013

(54) SEMICONDUCTOR DEVICE AND METHOD OF FORMING BOND-ON-LEAD INTERCONNECTION FOR MOUNTING SEMICONDUCTOR DIE IN FO-WLCSP

(75) Inventors: Reza A. Pagaila, Singapore (SG); Rajendra D. Pendse, Fremont, CA (US); Jun Mo Koo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 314 days.

(21) Appl. No.: 12/880,255

(22) Filed: Sep. 13, 2010

(65) Prior Publication Data
US 2012/0061824 A1    Mar. 15, 2012

(51) Int. Cl.
*H01L 21/50* (2006.01)
*H01L 21/48* (2006.01)
*H01L 21/44* (2006.01)

(52) U.S. Cl.
USPC ........... 438/106; 438/108; 438/112; 438/118; 438/124; 438/126; 257/E21.499; 257/E21.502; 257/E21.503; 257/E21.508; 257/E21.511

(58) Field of Classification Search ........... 257/E21.499, 257/E21.502, E21.503, E21.508, E21.511, 257/E21.589, E21.598
See application file for complete search history.

(56) References Cited

U.S. PATENT DOCUMENTS

| | | |
|---|---|---|
| 5,250,843 A | 10/1993 | Eichelberger |
| 5,353,498 A | 10/1994 | Fillion et al. |
| 5,378,859 A | 1/1995 | Shirasaki et al. |
| 5,386,624 A | 2/1995 | George et al. |
| 5,434,410 A | 7/1995 | Kulwicki |
| 5,508,561 A | 4/1996 | Tago et al. |
| 5,519,580 A | 5/1996 | Natarajan et al. |

(Continued)

FOREIGN PATENT DOCUMENTS

| | | |
|---|---|---|
| JP | 04-355933 | 9/1992 |
| JP | 10-256307 | 9/1998 |
| JP | 2000-031204 | 1/2000 |
| JP | 2004-221205 | 5/2004 |

OTHER PUBLICATIONS

Yamada, Hiroshi et al., "Advanced copper column based solder bump for flip-chip interconnection", International Symposium on Microelectronics, 1997, pp. 417-422, the British Library—"The world's knowledge".

(Continued)

*Primary Examiner* — Mohsen Ahmadi
(74) *Attorney, Agent, or Firm* — Robert D. Atkins; Patent Law Group: Atkins & Associates, P.C.

(57) ABSTRACT

A semiconductor die has a conductive layer including a plurality of trace lines formed over a carrier. The conductive layer includes a plurality of contact pads electrically continuous with the trace lines. A semiconductor die has a plurality of contact pads and bumps formed over the contact pads. A plurality of conductive pillars can be formed over the contact pads of the semiconductor die. The bumps are formed over the conductive pillars. The semiconductor die is mounted to the conductive layer with the bumps directly bonded to an end portion of the trace lines to provide a fine pitch interconnect. An encapsulant is deposited over the semiconductor die and conductive layer. The conductive layer contains wettable material to reduce die shifting during encapsulation. The carrier is removed. An interconnect structure is formed over the encapsulant and semiconductor die. An insulating layer can be formed over the conductive layer.

15 Claims, 13 Drawing Sheets

U.S. PATENT DOCUMENTS

| | | | |
|---|---|---|---|
| 5,650,595 A | 7/1997 | Bentlage et al. |
| 5,710,071 A | 1/1998 | Beddingfield et al. |
| 5,841,193 A | 11/1998 | Eichelberger |
| 5,844,782 A | 12/1998 | Fukasawa |
| 5,869,886 A | 2/1999 | Tokuno |
| 5,872,399 A | 2/1999 | Lee |
| 5,889,326 A | 3/1999 | Tanaka |
| 5,915,169 A | 6/1999 | Heo |
| 5,985,456 A | 11/1999 | Zhou et al. |
| 6,201,305 B1 | 3/2001 | Darveaux et al. |
| 6,218,630 B1 | 4/2001 | Takigami |
| 6,228,466 B1 | 5/2001 | Tsukada et al. |
| 6,259,163 B1 | 7/2001 | Ohuchi et al. |
| 6,281,450 B1 | 8/2001 | Urasaki et al. |
| 6,297,560 B1 | 10/2001 | Capote et al. |
| 6,324,754 B1 | 12/2001 | DiStefano et al. |
| 6,329,605 B1 | 12/2001 | Beroz et al. |
| 6,335,568 B1 | 1/2002 | Yuzawa et al. |
| 6,335,571 B1 | 1/2002 | Capote et al. |
| 6,396,707 B1 | 5/2002 | Huang et al. |
| 6,441,316 B1 | 8/2002 | Kusui |
| 6,448,665 B1 | 9/2002 | Nakasawa et al. |
| 6,573,610 B1 | 6/2003 | Tsai |
| 6,600,234 B2 | 7/2003 | Kuwabara et al. |
| 6,608,388 B2 | 8/2003 | Lin et al. |
| 6,710,458 B2 | 3/2004 | Seko |
| 6,734,557 B2 | 5/2004 | Taniguchi et al. |
| 6,774,497 B1 | 8/2004 | Qi et al. |
| 6,780,673 B2 | 8/2004 | Venkateswaran |
| 6,787,918 B1 | 9/2004 | Tsai et al. |
| 6,798,121 B2 | 9/2004 | Nakatani et al. |
| 6,809,262 B1 | 10/2004 | Hsu |
| 6,818,545 B2 | 11/2004 | Lee et al. |
| 6,849,944 B2 | 2/2005 | Murtuza et al. |
| 6,870,276 B1 | 3/2005 | Moxham et al. |
| 6,888,255 B2 | 5/2005 | Murtuza et al. |
| 6,913,948 B2 | 7/2005 | Caletka et al. |
| 7,005,585 B2 | 2/2006 | Ishizaki |
| 7,005,750 B2 | 2/2006 | Liu |
| 7,049,705 B2 | 5/2006 | Huang |
| 7,057,284 B2 | 6/2006 | Chauhan et al. |
| 7,064,435 B2 | 6/2006 | Chung et al. |
| 7,098,407 B2 | 8/2006 | Kim et al. |
| 7,102,239 B2 | 9/2006 | Pu et al. |
| 7,173,828 B2 | 2/2007 | Lin et al. |
| 7,187,072 B2 | 3/2007 | Fukutomi et al. |
| 7,224,073 B2 | 5/2007 | Kim |
| 7,242,099 B2 | 7/2007 | Lin et al. |
| 7,271,484 B2 | 9/2007 | Reiss et al. |
| 7,294,929 B2 | 11/2007 | Miyazaki |
| 7,317,245 B1 | 1/2008 | Lee et al. |
| 7,368,817 B2 | 5/2008 | Pendse |
| 7,405,484 B2 | 7/2008 | Usui et al. |
| 7,436,063 B2 | 10/2008 | Miyata et al. |
| 7,521,284 B2 | 4/2009 | Miranda et al. |
| 7,619,901 B2 | 11/2009 | Eichelberger et al. |
| 7,642,660 B2 | 1/2010 | Tay et al. |
| 7,670,939 B2 | 3/2010 | Topacio et al. |
| 7,671,454 B2 | 3/2010 | Seko |
| 7,700,407 B2 * | 4/2010 | Pendse ............. 438/107 |
| 7,732,913 B2 | 6/2010 | Hsieh et al. |
| 7,750,457 B2 | 7/2010 | Seko |
| 7,790,509 B2 | 9/2010 | Gerber |
| 7,791,211 B2 | 9/2010 | Chen et al. |
| 7,847,399 B2 | 12/2010 | Masumoto |
| 7,847,417 B2 | 12/2010 | Araki et al. |
| 7,851,928 B2 | 12/2010 | Gallegos et al. |
| 7,898,083 B2 | 3/2011 | Castro |
| 7,902,660 B1 | 3/2011 | Lee et al. |
| 7,902,678 B2 | 3/2011 | Ohuchi et al. |
| 7,902,679 B2 | 3/2011 | Lin et al. |
| 7,932,170 B1 | 4/2011 | Huemoeller et al. |
| 7,947,602 B2 | 5/2011 | Ito et al. |
| 2004/0056341 A1 | 3/2004 | Endo et al. |
| 2004/0232562 A1 | 11/2004 | Hortaleza et al. |
| 2005/0103516 A1 | 5/2005 | Kaneyuki |
| 2005/0248037 A1 | 11/2005 | Hung et al. |
| 2006/0131758 A1 | 6/2006 | Dao |
| 2007/0114661 A1 | 5/2007 | Choi et al. |
| 2007/0200234 A1 | 8/2007 | Gerber et al. |
| 2008/0093749 A1 | 4/2008 | Gerber et al. |
| 2008/0179740 A1 | 7/2008 | Liao |
| 2008/0277802 A1 | 11/2008 | Tsai et al. |
| 2008/0296759 A1 | 12/2008 | Ramakrishna et al. |
| 2009/0108445 A1 | 4/2009 | Liang |
| 2009/0114436 A1 | 5/2009 | Chen et al. |
| 2009/0152716 A1 | 6/2009 | Sohara |
| 2009/0191329 A1 | 7/2009 | Wang |
| 2009/0288866 A1 | 11/2009 | Tsai et al. |
| 2009/0308647 A1 | 12/2009 | Liao |
| 2010/0139965 A1 | 6/2010 | Wang et al. |
| 2010/0270661 A1 * | 10/2010 | Pagaila et al. .......... 257/659 |
| 2011/0049703 A1 | 3/2011 | Hsu et al. |
| 2011/0187005 A1 * | 8/2011 | Pagaila et al. .......... 257/777 |
| 2011/0221058 A1 * | 9/2011 | Pagaila et al. .......... 257/737 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

* cited by examiner

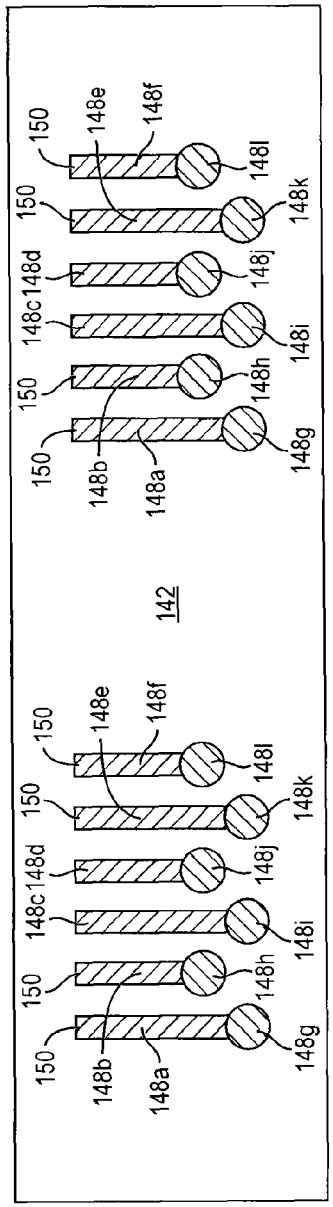
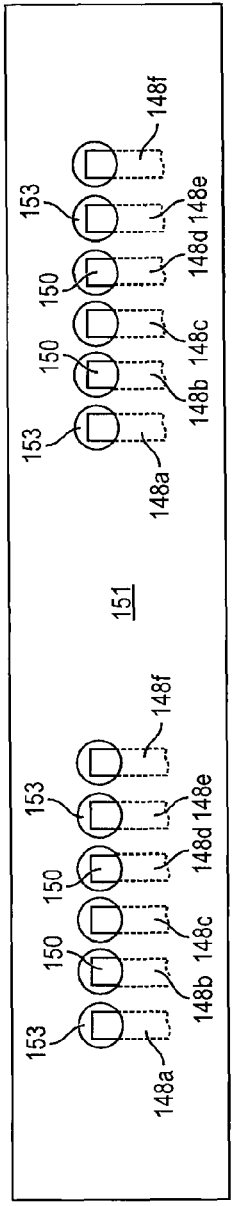
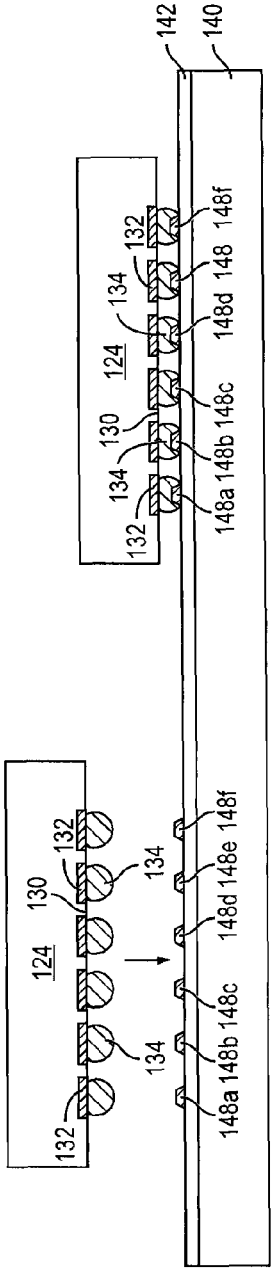
FIG. 4g
FIG. 4h
FIG. 4i

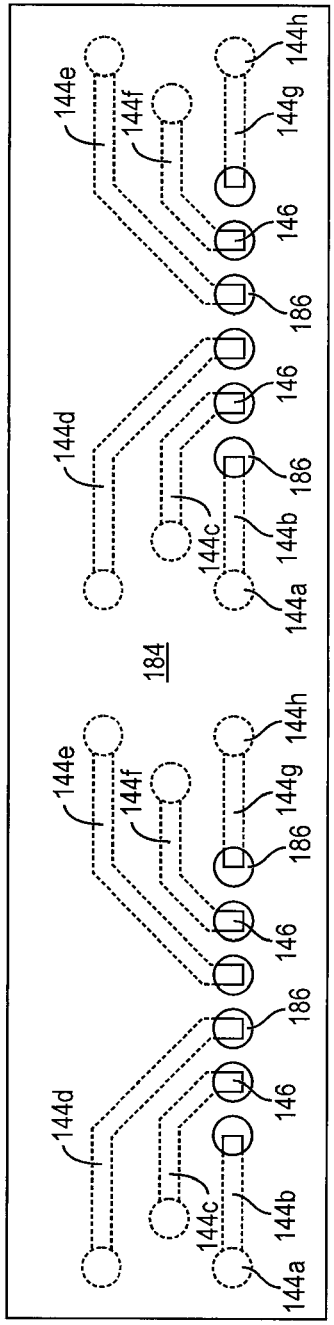
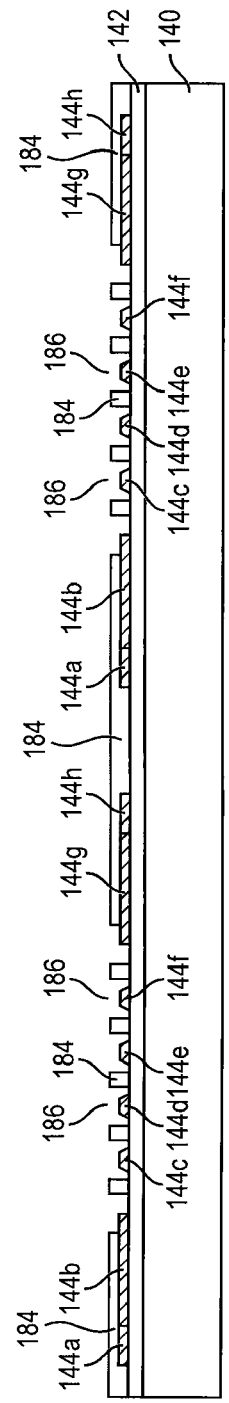
FIG. 8a
FIG. 8b

SEMICONDUCTOR DEVICE AND METHOD OF FORMING BOND-ON-LEAD INTERCONNECTION FOR MOUNTING SEMICONDUCTOR DIE IN FO-WLCSP

FIELD OF THE INVENTION

The present invention relates in general to semiconductor devices and, more particularly, to a semiconductor substrate and method of forming a bond-on-lead or bond-on-trace interconnect for mounting a semiconductor die in a Fo-WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In conventional fan-out wafer level chip scale packages (Fo-WLCSP), a bumped semiconductor die is typically mounted to a carrier and enclosed by an encapsulant. The carrier is removed and a build-up interconnect structure is formed over the encapsulant and semiconductor die. The bumps on the semiconductor die are typically bonded to a bump pad formed on the carrier or within the interconnect structure. The bump pads increase interconnect pitch and decrease input/output (I/O) count.

SUMMARY OF THE INVENTION

A need exists to provide a fine pitch interconnect for a semiconductor die in a Fo-WLCSP. Accordingly, in one embodiment, the present invention is a method of making a semiconductor device comprising the steps of providing a carrier, forming a conductive layer including a plurality of trace lines over the carrier, providing a semiconductor die having a plurality of contact pads and first bumps formed over the contact pads, mounting the semiconductor die to the conductive layer with the first bumps directly bonded to an end portion of the trace lines, depositing an encapsulant over the semiconductor die and conductive layer, removing the carrier, and forming an interconnect structure over the encapsulant and semiconductor die.

In another embodiment, the present invention is a method of making a semiconductor device comprising the steps of providing a carrier, forming a conductive layer including a plurality of trace lines over the carrier, providing a semiconductor die having a plurality of contact pads and first bumps formed over the contact pads, mounting the semiconductor die to the conductive layer with the first bumps directly bonded to the trace lines, and depositing an encapsulant over the semiconductor die and conductive layer. The conductive layer includes wettable material to reduce shifting of the semiconductor die during encapsulation. The method further includes the steps of removing the carrier, and forming an interconnect structure over the encapsulant and semiconductor die.

In another embodiment, the present invention is a method of making a semiconductor device comprising the steps of forming a conductive layer including a plurality of trace lines, providing a semiconductor die having a plurality of contact pads and first bumps formed over the contact pads, mounting the semiconductor die to the conductive layer with the first bumps directly bonded to the trace lines, and depositing an encapsulant over the semiconductor die and conductive layer.

In another embodiment, the present invention is a semiconductor device comprising a conductive layer including a plurality of trace lines. A semiconductor die has a plurality of contact pads and first bumps formed over the contact pads. The semiconductor die is mounted to the conductive layer with the first bumps directly bonded to the trace lines. An encapsulant is deposited over the semiconductor die and conductive layer. An interconnect structure is formed over the encapsulant and semiconductor die.

BRIEF DESCRIPTION OF THE DRAWINGS

FIGS. 8a-8c illustrates the semiconductor die mounted to the BOL interconnect with a masking layer.

DETAILED DESCRIPTION OF THE DRAWINGS

Figure 1:
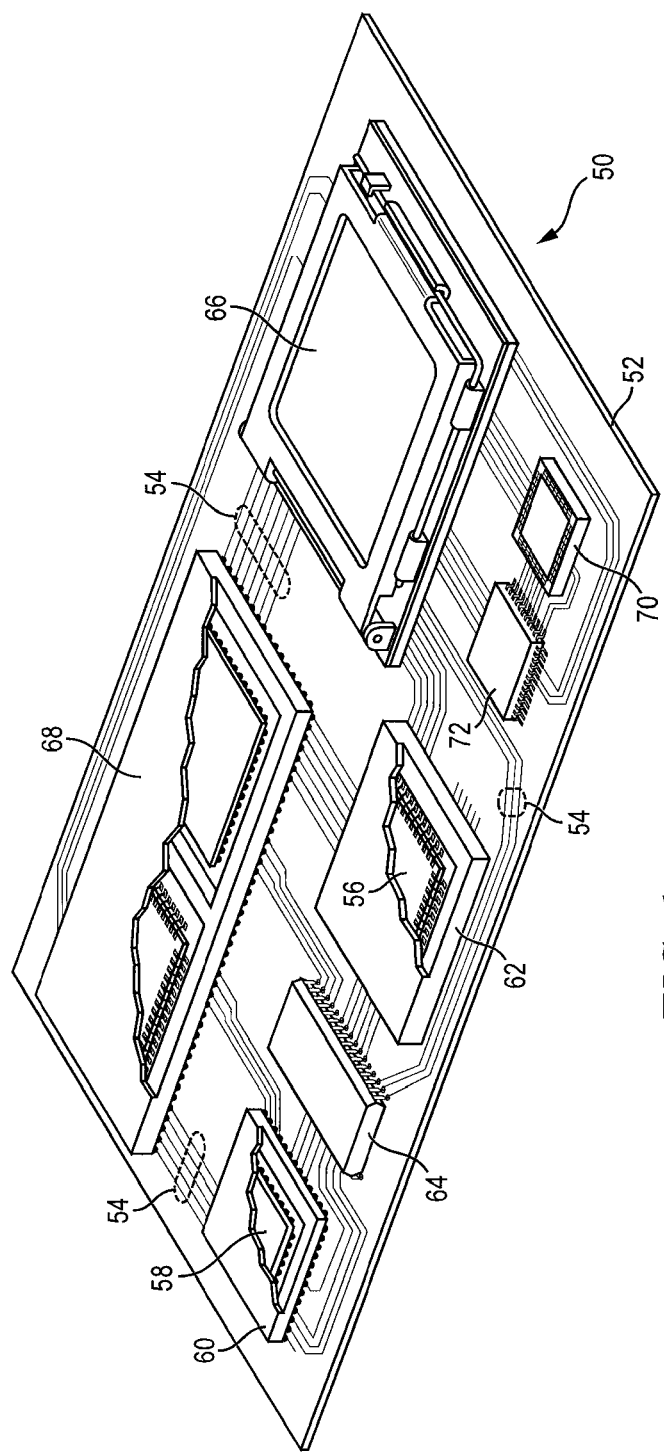
FIG. 1 illustrates the PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
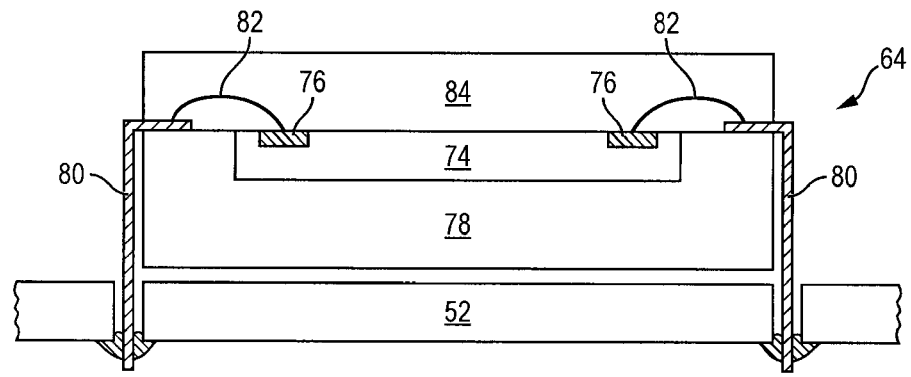
FIGS. 2a-2c illustrate further detail of the representative semiconductor packages mounted to the PCB.
Figure 2B:
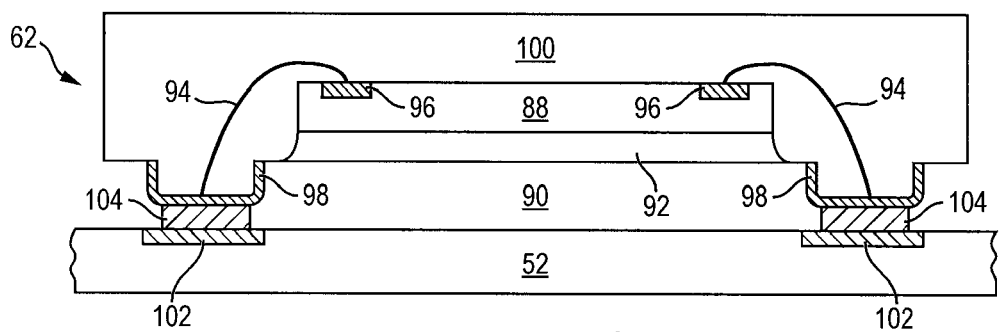
Figure 2C:
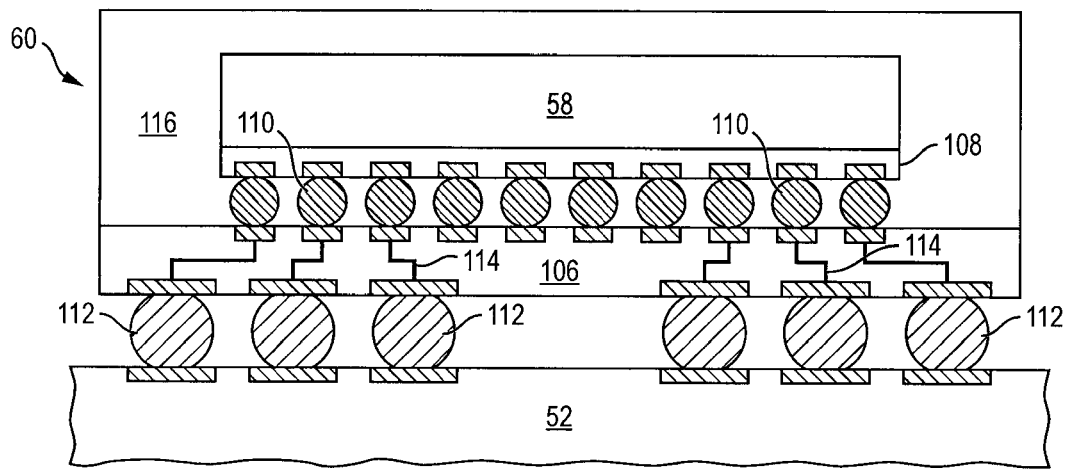

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
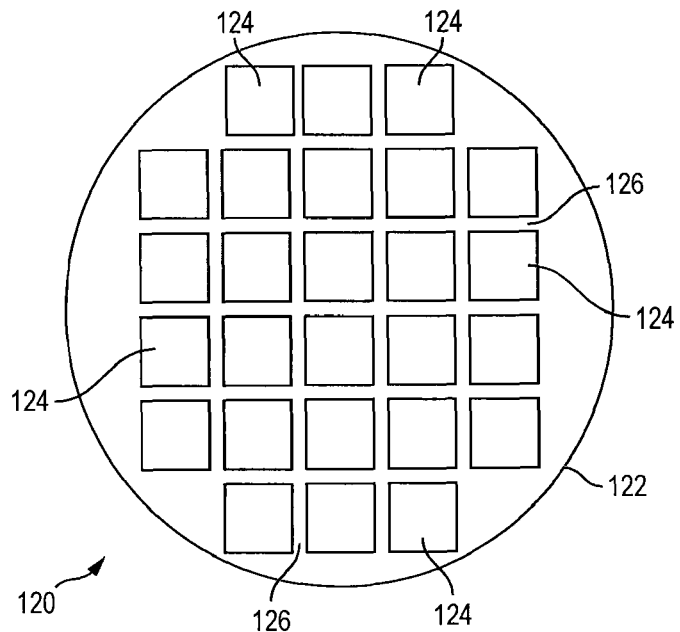
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

Figure 3B:
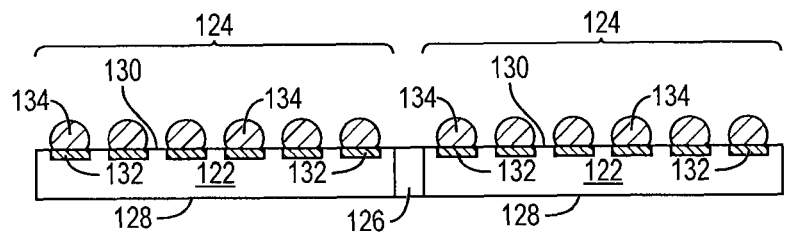

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed over contact pads 132. Alternatively, microbumps or stud bumps can be formed over contact pads 132.

Figure 3C:
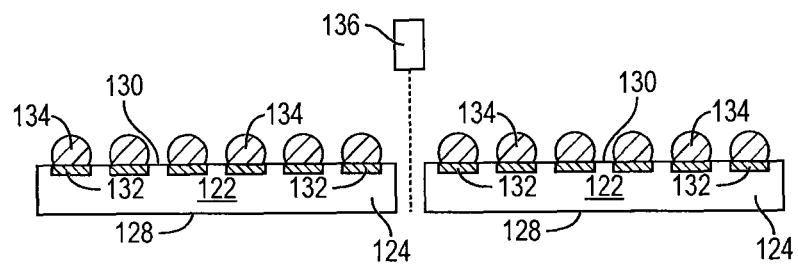

In FIG. 3c, semiconductor wafer 120 is singulated through saw street 126 using a saw blade or laser cutting tool 136 into individual semiconductor die 124.

Figure 4A:
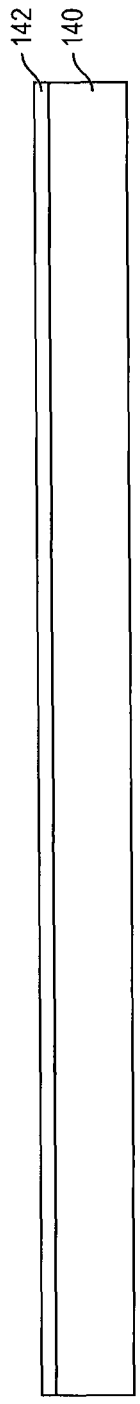
FIGS. 4a-4s illustrate a process of forming a BOL interconnect for mounting a semiconductor die in a Fo-WLCSP.
Figure 4B:
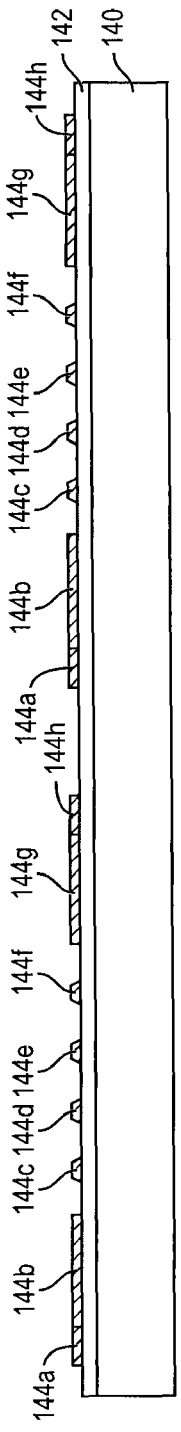
Figure 4C:
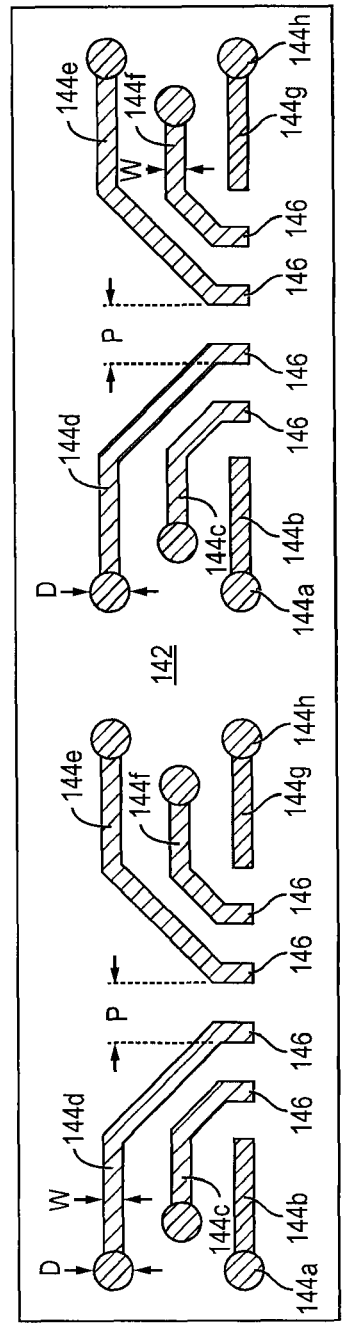
Figure 4D:
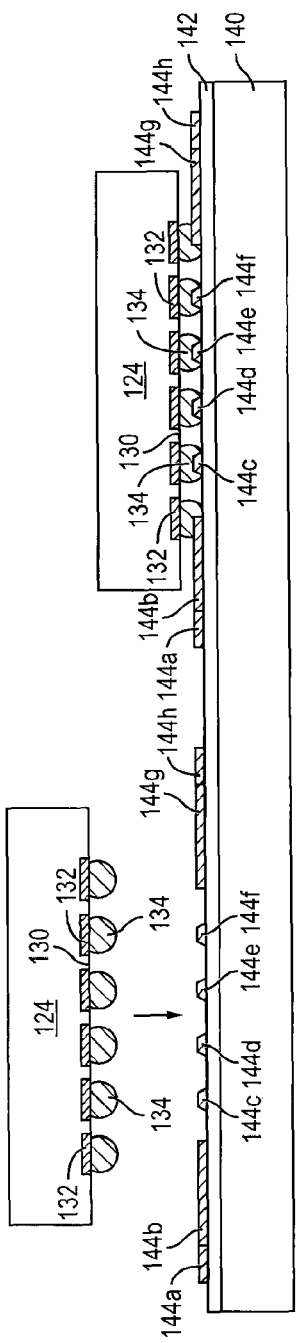
Figure 4E:
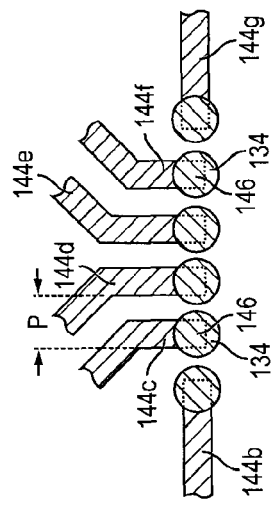
Figure 4F:
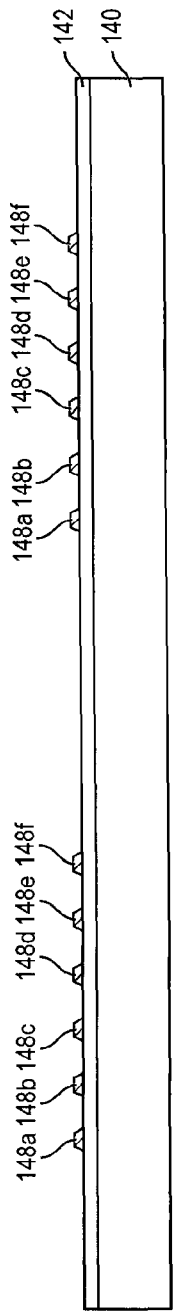
Figure 4J:
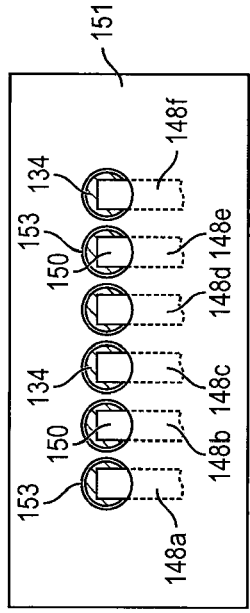
Figure 4K:
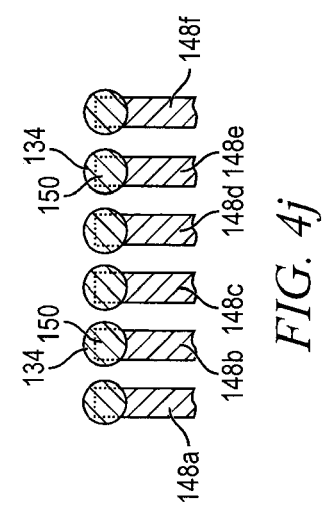
Figure 4L:
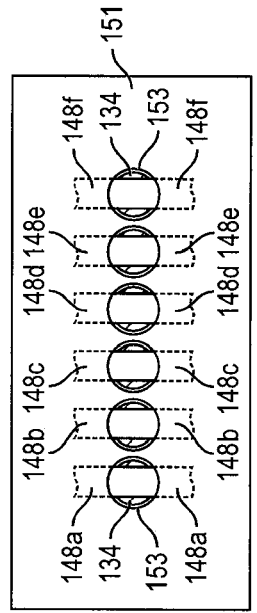
Figure 4M:
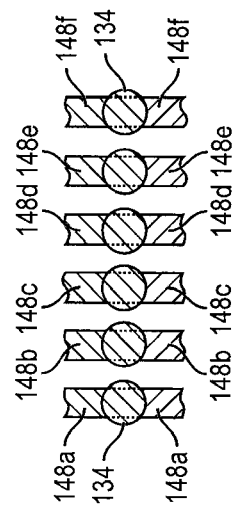
Figure 4N:
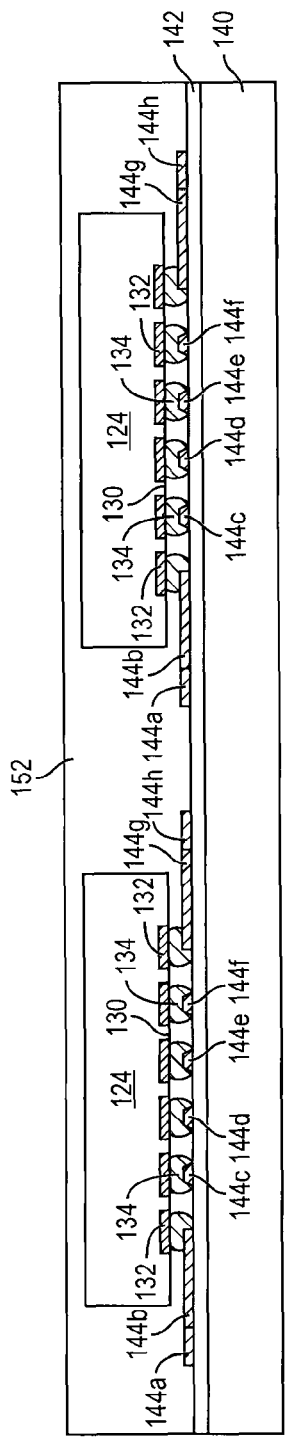
Figure 4O:
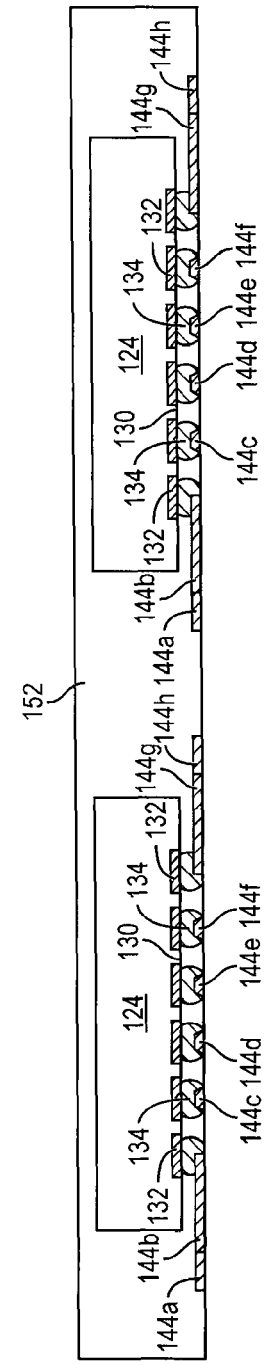
Figure 4P:
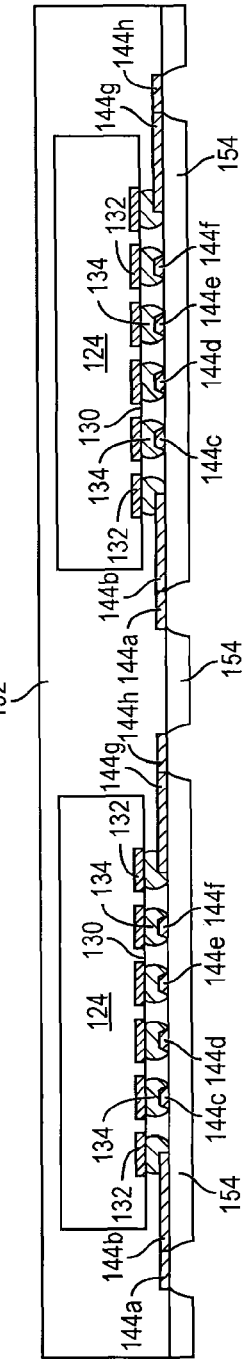
Figure 4Q:
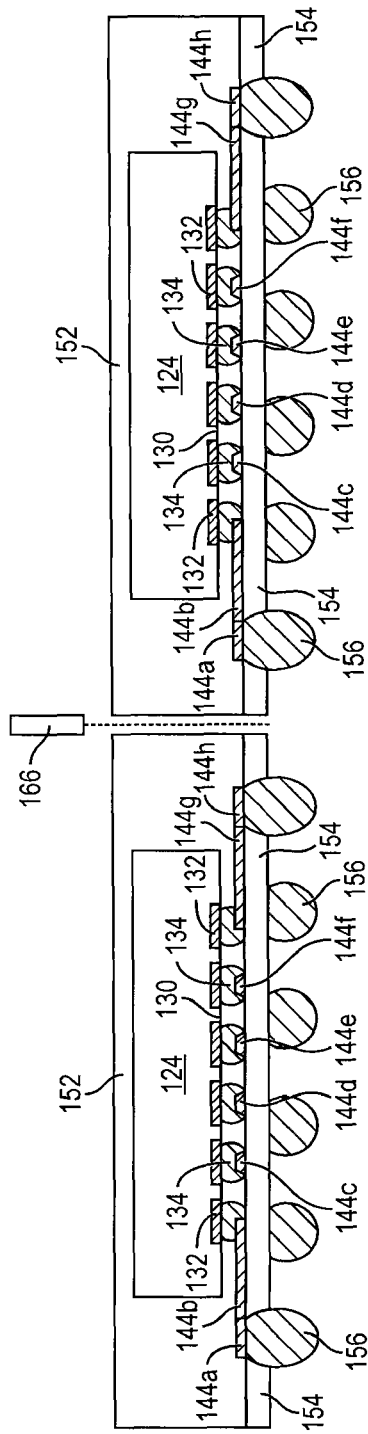
Figure 4R:
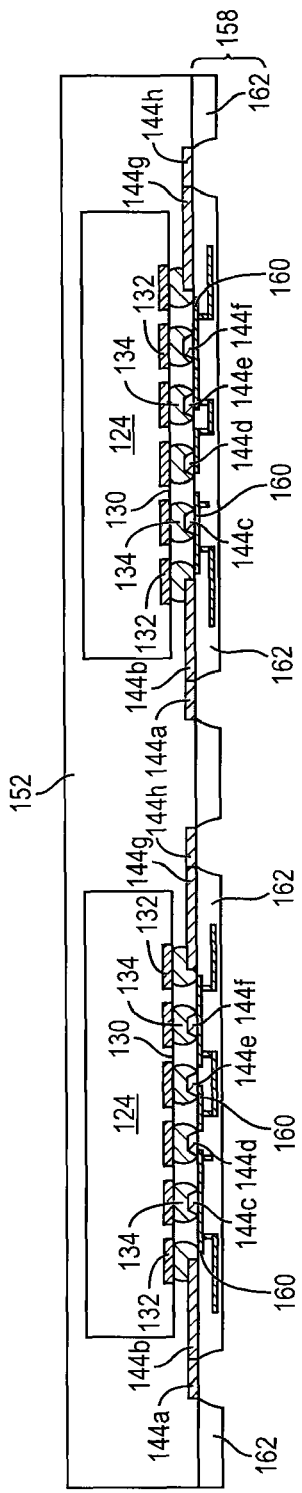
Figure 4S:
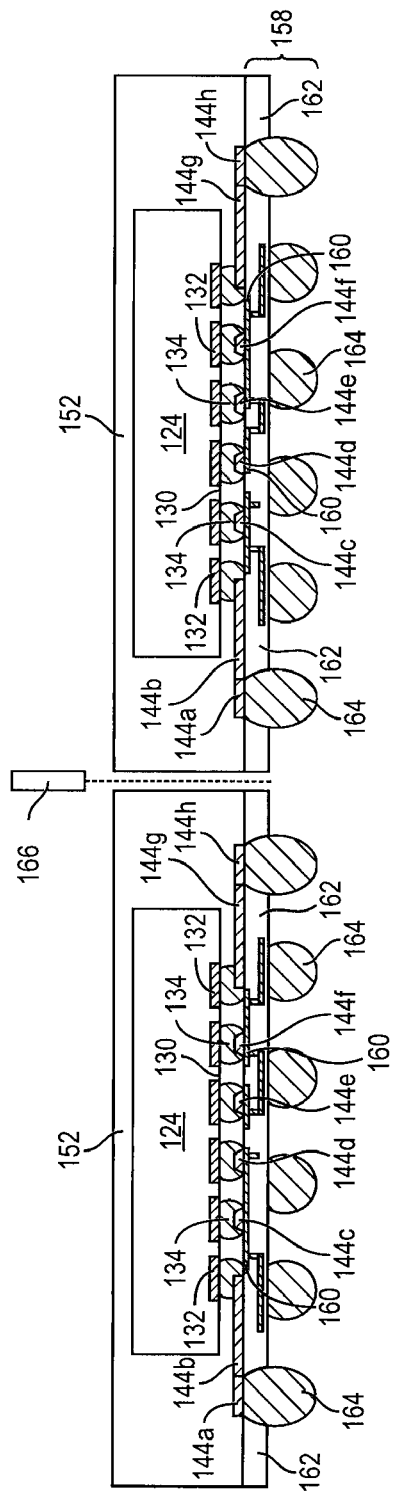

FIGS. 4a-4s illustrate, in relation to FIGS. 1 and 2a-2c, a process of forming a bond-on-trace (BOT) or bond-on-lead (BOL) interconnect for mounting a semiconductor die in a Fo-WLCSP. In FIG. 4a, a substrate or carrier 140 contains temporary or sacrificial base material such as silicon, polymer, beryllium oxide, or other suitable low-cost, rigid material for structural support. An interface layer or double-sided tape 142 is formed over carrier 140 as a temporary adhesive bonding film or etch-stop layer.

In FIG. 4b, an electrically conductive layer 144 is formed over interface layer 142 and carrier 140 using PVD, CVD, electrolytic plating, electroless plating process, or other suitable metal deposition process. Conductive layer 144 can be one or more layers of Al, Cu, Sn, Ni, Au, Ag, or other suitable electrically conductive material. Conductive layer 144 contains contact pads 144a and 144h and signal trace lines or leads 144b, 144c, 144d, 144e, 144f, and 144g. FIG. 4c shows a top view of a portion of interface layer 142 with contact pads 144a and 144h and signal trace lines 144b-144g. Contact pad 144a is electrically continuous with signal trace line 144b, and contact pad 144h is electrically continuous with signal trace line 144g. In one embodiment, contact pads 144a and 144h have a width or diameter D of 150-250 micrometers (µm), and signal trace lines 144b-144g have a width W of 60-90 µm. Contact pads 144a and 144h and signal trace lines 144b-144g are placed close together and offset for a fine pitch. In one embodiment, the pitch P of trace lines 144b-144g is about 80-110 µm. Additional contact pads and trace lines for conductive layer 144 can be formed in the lateral and vertical directions. Trace lines 144b-144g have an end portion or tip 146 terminating at a location designated for alignment with bumps 134 of semiconductor die 124. Additional contact pads and trace lines for conductive layer 144 can be formed in the lateral and vertical directions.

In FIG. 4d, semiconductor die 124 from FIG. 3a-3c are mounted over interface layer 142 with active surface 130 oriented toward carrier 140 using a pick and place operation. In particular, bumps 134 are aligned with tips 146 of signal trace lines 144b-144g. Tips 146 of signal trace lines 144b-144g provide alignment marks during die mounting. Bumps 134 of semiconductor die 124 are metallurgically and electrically connected to tips 146 of signal trace lines 144b-144g as a BOT or BOL interconnect. FIG. 4e shows a top view of bumps 134 of semiconductor die 124 metallurgically and electrically connected to tips 146 of signal trace lines 144b-144g. The diameter of bump 134 is greater than the width of trace lines 144b-144g. The pitch P of trace lines 144b-144g can be reduced as bumps 134 are bonded directly to the trace line, as distinguished from a conventional dedicated bump pad.

In another embodiment, an electrically conductive layer 148 is formed over interface layer 142 and carrier 140 using PVD, CVD, electrolytic plating, electroless plating process, or other suitable metal deposition process, as shown in FIG. 4f. Conductive layer 148 can be one or more layers of Al, Cu, Sn, Ni, Au, Ag, or other suitable electrically conductive material. Conductive layer 148 contains signal trace lines or leads 148a, 148b, 148c, 148d, 148e, and 148f, and contact pads 148g, 148h, 148i, 148j, 148k, and 148l. FIG. 4g shows a top view of a portion of interface layer 142 with signal trace lines 148a-148f and offset contact pads 148g-148l. Contact pads 148g-148l are electrically continuous with signal trace lines 148a-148f, respectively. In one embodiment, signal trace lines 148a-148f have a width W of 60-90 µm, and contact pads 148g-148l have a width or diameter D of 150-250 µm. Signal trace lines 148a-148f and contact pads 148g-148l are placed close together and offset for a fine pitch. In one embodiment, the pitch P of trace lines 148a-148f is about 80-110 µm. Trace lines 148a-148f have an end portion or tip 150 terminating at a location designated for alignment with bumps 134 of semiconductor die 124. Additional contact pads and trace lines for conductive layer 148 can be formed in the lateral and vertical directions.

An optional masking layer 151 can be formed over signal trace lines 148a-148f, as shown in FIG. 4h. A plurality of openings 153 is formed in masking layer 151 over tips 150 of trace lines 148a-148f.

In FIG. 4i, semiconductor die 124 from FIG. 3a-3c are mounted over interface layer 142 with active surface 130 oriented toward carrier 140 using a pick and place operation. In particular, bumps 134 are aligned with tips 150 of signal trace lines 148a-148f. Tips 150 of signal trace lines 148a-148f provide alignment marks during die mounting. Bumps 134 of semiconductor die 124 are metallurgically and electrically connected to tips 150 of signal trace lines 148a-148f as BOT or BOL.

FIG. 4j shows a top view of bumps 134 of semiconductor die 124 metallurgically and electrically connected to tips 150 of signal trace lines 148a-148f. The diameter of bump 134 is greater than the width of trace lines 148a-148f. The pitch P of trace lines 148a-148f can be reduced as bumps 134 are bonded directly to the trace line, as distinguished from a conventional dedicated bump pad. FIG. 4k shows bumps 134 of semiconductor die 124 metallurgically and electrically connected to tips 150 of signal trace lines 148a-148f through openings 153 of masking layer 151.

FIG. 4l shows another embodiment with bumps 134 metallurgically and electrically connected to an intermediate portion of signal trace lines 148a-148f. That is, signal trace lines 148a-148f extend beyond bumps 134 in both directions. FIG. 4m shows bumps 134 of semiconductor die 124 metallurgically and electrically connected to the intermediate portion of signal trace lines 148a-148f through openings 153 of masking layer 151.

Continuing from FIG. 4e or FIG. 4j, an encapsulant or molding compound 152 is deposited over semiconductor die 124, carrier 140, and conductive layer 144 using a paste printing, compressive molding, transfer molding, liquid encapsulant molding, vacuum lamination, spin coating, or other suitable applicator, as shown in FIG. 4n. Encapsulant 152 can be polymer composite material, such as epoxy resin with filler, epoxy acrylate with filler, or polymer with proper filler. Encapsulant 152 is non-conductive and environmentally protects the semiconductor device from external elements and contaminants. Conductive layer 144 can be wettable material, such as a flux material, to securely hold semiconductor die 124 in place and reduce shifting during encapsulation.

In FIG. 4o, carrier 140 and interface layer 142 are removed by chemical etching, mechanical peeling, CMP, mechanical grinding, thermal bake, UV light, laser scanning, or wet stripping to expose semiconductor die 124, conductive layer 144, and encapsulant 152.

In FIG. 4p, a solder mask or insulating layer 154 is formed over semiconductor die 124, conductive layer 144, and encapsulant 152. A portion of solder mask layer 154 is removed by an etching process to expose conductive layer 144 for additional electrical interconnect.

In FIG. 4q, an electrically conductive bump material is deposited over the exposed portion of conductive layer 144a and 144h using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layers 144 using a suitable attachment or bonding process. In one embodiment, the bump material is reflowed by heating the material above its melting point to form spherical balls or bumps 156. In some applications, bumps 156 are reflowed a second time to improve electrical contact to conductive layer 144. An under bump metallization (UBM) can be formed under bumps 156. The bumps can also be compression bonded to conductive layer 144. Bumps 156 represent one type of interconnect structure that can be formed over conductive layer 144. The interconnect structure can also use bond wires, stud bump, micro bump, or other electrical interconnect.

In another embodiment, a build-up interconnect structure 158 is formed over semiconductor die 124, conductive layer 144, and encapsulant 152, as shown in FIG. 4r. The build-up interconnect structure 158 includes an electrically conductive layer or redistribution layer (RDL) 160 formed using a patterning and metal deposition process such as sputtering, electrolytic plating, and electroless plating. Conductive layer 160 can be one or more layers of Al, Cu, Sn, Ni, Au, Ag, or other suitable electrically conductive material. One portion of conductive layer 160 is electrically connected to conductive layer 144. Other portions of conductive layer 160 can be electrically common or electrically isolated depending on the design and function of semiconductor die 124.

An insulating or passivation layer 162 is formed around conductive layer 160 for electrical isolation using PVD, CVD, printing, spin coating, spray coating, sintering or thermal oxidation. The insulating layer 162 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 162 is removed by an etching process to expose conductive layer 160 for additional electrical interconnect.

In FIG. 4s, an electrically conductive bump material is deposited over build-up interconnect structure 158 and electrically connected to the exposed portion of conductive layers 160, 144a, and 144g using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layers 144 and 160 using a suitable attachment or bonding process. In one embodiment, the bump material is reflowed by heating the material above its melting point to form spherical balls or bumps 164. In some applications, bumps 164 are reflowed a second time to improve electrical contact to conductive layers 144 and 160. A UBM can be formed under bumps 164. The bumps can also be compression bonded to conductive layers 144 and 160. Bumps 164 represent one type of interconnect structure that can be formed over conductive layers 144 and 160. The interconnect structure can also use bond wires, stud bump, micro bump, or other electrical interconnect.

Figure 5:
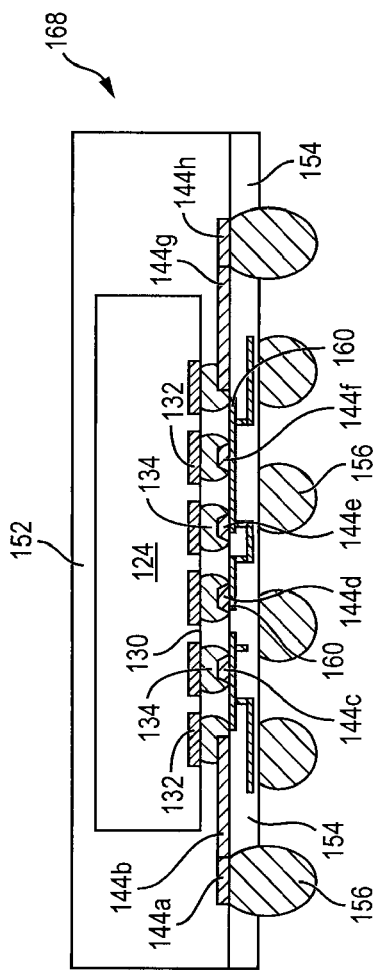
FIG. 5 illustrates the semiconductor die mounted to the BOL interconnect.

Continuing from FIG. 4q or 4s, semiconductor die 124 are singulated through encapsulant 152 and insulating layer 154 (or build-up interconnect structure 158) with saw blade or laser cutting tool 166 into individual Fo-WLCSP 168. FIG. 5 shows the Fo-WLCSP 168 from FIG. 4q after singulation. Semiconductor die 124 is electrically connected through contact pads 132 and bumps 134 to conductive layer 144 and bumps 156. Bumps 134 are bonded to tips 146 of conductive layer 144b-144g as BOT or BOL for a fine interconnect pitch and increased I/O count.

Figure 6:
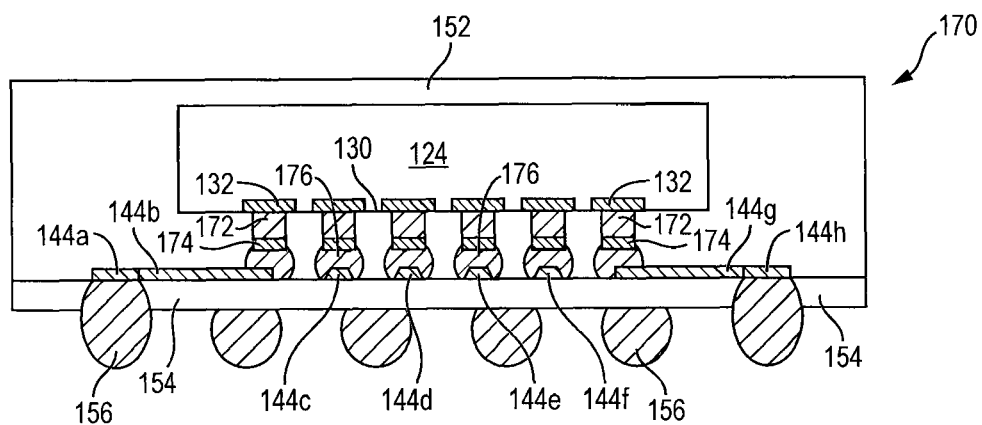
FIG. 6 illustrates conductive pillars formed over the contact pads of the semiconductor die.

FIG. 6 shows an embodiment of Fo-WLCSP 170, similar to FIG. 5, with conductive pillars 172 formed over contact pads 132 while in wafer form, see FIGS. 3a-3c. Conductive pillars 172 contain non-collapsible or non-fusible material, such as Au, Cu, Ni, high-lead solder, or lead-tin alloy. A conductive layer 174, such as Ni, is formed over conductive pillars 172. Bumps 176 are formed over conductive layer 174. Bumps 174 contain collapsible or fusible material, such as Sn, lead-free alloy, Sn—Ag alloy, Sn—Ag—Cu alloy, Sn—Ag-indium (In) alloy, eutectic solder, other tin alloys with Ag, Cu, or Pb, or other relatively low temperature melt solder.

Semiconductor die 124 with conductive pillars 172 and bumps 176 is bonded to conductive layer 144b-144g with application of a reflow temperature and pressure. Conductive pillars 172 do not deform or melt with the application of pressure and reflow temperature and retain their form and shape. Accordingly, conductive pillars 172 can be dimensioned to provide a standoff distance between active surface 130 of semiconductor die 124 and conductive layer 144.

Figure 7:
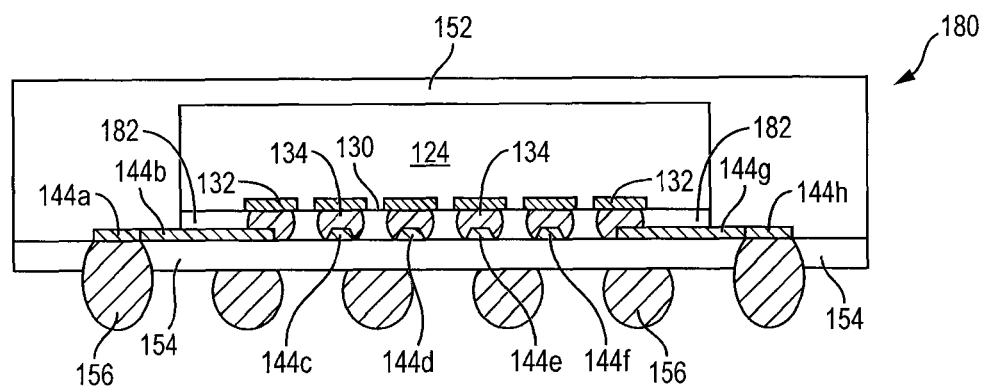
FIG. 7 illustrates a no-flow underfill material deposited over the BOL interconnect.

FIG. 7 shows an embodiment of Fo-WLCSP 180, similar to FIG. 5, with an insulating layer 182 formed over conductive layer 144 prior to mounting semiconductor die 124. The insulating layer 182 contains one or more layers of SiO2, Si3N4, SiON, Ta2O5, Al2O3, or other material having similar insulating and structural properties. The insulating layer 182 can be a no-flow underfill material.

In another embodiment, continuing from FIG. 4c, a masking layer 184 is formed over carrier 140, interface layer 142, contact pads 144a and 144h, and trace lines 144b-144g as shown in FIG. 8a. With a bump height of 15 μm, the thickness of masking layer 184 is about 85 μm. A plurality of openings 186 is formed in masking layer 184 over tips 146 of trace lines 144b-144g. FIG. 8b shows a cross-sectional view of masking layer 184 formed over carrier 140 with openings 186 exposing tips 146. Semiconductor die 124 is mounted to trace lines 144b-144g, similar to FIG. 4h, with the reflow of bumps 134 confined by masking layer 184. Encapsulant 152 is deposited over semiconductor die 124 and carrier 140, similar to FIG. 4k. Carrier 140 is removed and insulating layer 154 is formed over semiconductor die 124 and encapsulant 152, similar to FIGS. 4o-4p. A portion of insulating layer 154 is removed and bumps 156 are formed over contact pads 144a and 144g, similar to FIGS. 4p-4q.

Figure 8C:
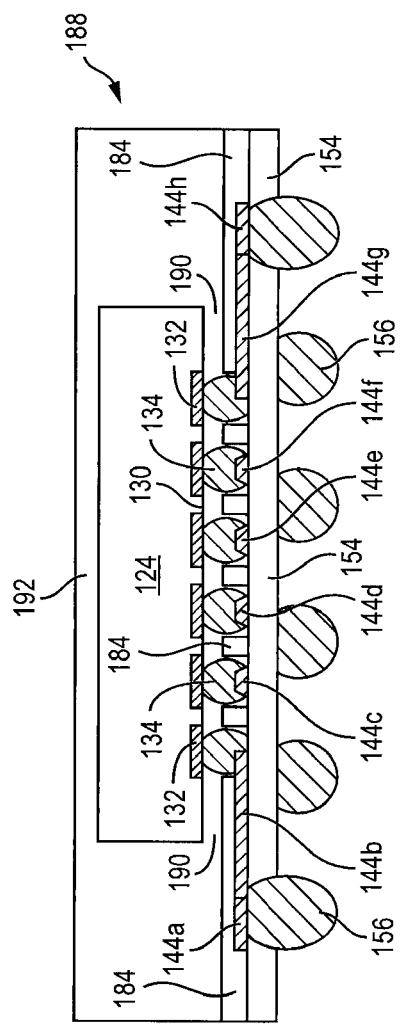

FIG. 8c shows Fo-WLCSP 188 with masking layer 184. A gap 190 exists between semiconductor die 124 and masking layer 184 for mold underfill (MUF) of the semiconductor die. In one embodiment, gap 190 is about 70-100 μm. A MUF or encapsulant material 192 is deposited through gap 190 around semiconductor die 124, including over and under the die. MUF 192 can be pumped from a reservoir to a dispensing needle. MUF 192 is injected under pressure from the dispensing needle through gap 190 under semiconductor die 124 and around bumps 134. A vacuum assist can draw MUF 192 to aid with uniform distribution. MUF 192 can be polymer composite material, such as epoxy resin with filler, epoxy acrylate with filler, or polymer with proper filler. MUF 192 is non-conductive and environmentally protects the semiconductor device from external elements and contaminants.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   forming a conductive layer including a plurality of trace lines over the carrier;
   providing a semiconductor die having a plurality of contact pads;
   forming a plurality of conductive pillars over the contact pads of the semiconductor die, then;
   forming a plurality of first bumps in direct contact with the conductive pillars, then;
   mounting the semiconductor die to the conductive layer with the first bumps directly bonded to an end portion of the trace lines, then;
   depositing an encapsulant over the semiconductor die and conductive layer, then;
   removing the carrier; and then;
   forming an interconnect structure over the encapsulant and semiconductor die.

2. The method of claim 1, wherein the conductive layer includes wettable material to reduce shifting of the semiconductor die during encapsulation.

3. The method of claim 1, further including:
   forming a masking layer over the carrier and conductive layer; and
   forming an opening in the masking layer over the end portion of the trace lines.

4. The method of claim 3, wherein forming the interconnect structure includes:
   forming an insulating layer over the encapsulant and semiconductor die; and
   forming a plurality of second bumps over the conductive layer.

5. The method of claim 1, further including forming an insulating layer over the conductive layer prior to mounting the semiconductor die.

6. A method of making a semiconductor device, comprising:
   providing a carrier;
   forming a conductive layer including a plurality of trace lines over the carrier;
   providing a semiconductor die having a plurality of contact pads;
   forming a plurality of conductive pillars over the contact pads of the semiconductor die, then;
   forming a plurality of first bumps in direct contact with the conductive pillars, then;
   mounting the semiconductor die to the conductive layer with the first bumps directly bonded to the trace lines, then;
   depositing an encapsulant over the semiconductor die and conductive layer, wherein the conductive layer includes wettable material to reduce shifting of the semiconductor die during encapsulation, then;
   removing the carrier; and then;
   forming an interconnect structure over the encapsulant and semiconductor die.

7. The method of claim 6, further including mounting the semiconductor die to the conductive layer with the first bumps directly bonded to an end portion of the trace lines.

8. The method of claim 6, further including depositing the encapsulant under the semiconductor die with a mold underfill process.

9. The method of claim 6, wherein forming the interconnect structure includes:
   forming an insulating layer over the encapsulant and semiconductor die; and
   forming a plurality of second bumps over the second conductive layer.

10. The method of claim 6, further including forming an insulating layer over the conductive layer prior to mounting the semiconductor die.

11. The method of claim 10, wherein the insulating layer includes a no-flow underfill material.

12. A method of making a semiconductor device, comprising:
    forming a conductive layer including a plurality of trace lines;
    providing a semiconductor die having a plurality of contact pads;
    forming a plurality of conductive pillars over the contact pads of the semiconductor die, then;
    forming a plurality of first bumps in direct contact with the conductive pillars, then;
    mounting the semiconductor die to the conductive layer with the first bumps directly bonded to the trace lines, then;
    depositing an encapsulant over the semiconductor die and conductive layer; and then;
    forming an interconnect structure over the encapsulant and semiconductor die by,
    (a) forming an insulating layer, and
    (b) forming a plurality of second bumps over the conductive layer.

13. The method of claim 12, further including mounting the semiconductor die to the conductive layer with the first bumps directly bonded to an end portion of the trace lines.

14. The method of claim 12, wherein the first bumps are wider than the trace lines.

15. The method of claim 12, further including:
    forming a masking layer over the carrier and conductive layer; and
    forming an opening in the masking layer over the end portion of the trace lines.

* * * * *